United States Patent
Chow

(10) Patent No.: US 6,727,153 B2
(45) Date of Patent: Apr. 27, 2004

(54) SUPERLATTICE FABRICATION FOR INAS/GASB/ALSB SEMICONDUCTOR STRUCTURES

(75) Inventor: David H. Chow, Newbury Park, CA (US)

(73) Assignee: HRL Laboratories, LLC, Malibu, CA (US)

(*) Notice: Subject to any disclaimer, the term of this patent is extended or adjusted under 35 U.S.C. 154(b) by 177 days.

(21) Appl. No.: 09/949,525

(22) Filed: Sep. 7, 2001

(65) Prior Publication Data

US 2002/0070390 A1 Jun. 13, 2002

Related U.S. Application Data

(62) Division of application No. 09/389,759, filed on Sep. 2, 1999, now Pat. No. 6,320,212.

(51) Int. Cl.[7] .................... H01L 21/331; H01L 31/0328
(52) U.S. Cl. ................. 438/312; 438/235; 438/309; 257/197; 257/198
(58) Field of Search ................. 438/235, 309, 438/312; 257/15, 20, 28, 200, 201, 197, 198

(56) References Cited

U.S. PATENT DOCUMENTS

| | | | |
|---|---|---|---|
| 4,835,579 A | * 5/1989 | Ishibasshi et al. | 357/4 |
| 5,159,421 A | 10/1992 | Wolff | 357/30 |
| 5,296,721 A | 3/1994 | Schulman et al. | 257/25 |
| 5,489,785 A | 2/1996 | Tehrani et al. | 257/23 |
| 5,541,614 A | 7/1996 | Lam et al. | 343/792.5 |
| 5,543,628 A | 8/1996 | Chow et al. | 257/17 |
| 5,577,061 A | 11/1996 | Hasenberg et al. | 372/45 |
| 5,594,750 A | 1/1997 | Zhang et al. | 372/45 |
| 5,606,178 A | 2/1997 | Schulman et al. | 257/25 |
| 5,753,545 A | 5/1998 | Liu et al. | 438/172 |

OTHER PUBLICATIONS

Bolognesi, C.R., et al., "High–Transconductance Delta–Doped InAs/AlSb HFET's with Ultrathin Silicon–Doped InAs Quantum Well Donor Layer," *IEEE Electron Device Letters*, vol. 19, No. 3, pp. 83–85 (1998).

Chow, D.H., et al., "InAs/A1Sb/GaSb Resonant Interband Tunneling Diodes and Au–on–InAs/A1Sb–Superlattice Schottky Diodes for Logic Circuits," *IEEE Electron Device Letters*, vol. 17, No. 2, pp. 69–71 (1996).

Chow, D.H., et al., "Mid–wave Infrared Diode Lasers Based on GaInSb/InAs and InAs/AlSb Superlattices," *Appl. Phyl. Lett.*, vol. 67, No. 25, pp. 3700–3702 (1995).

Chow, D.H., et al., "Structural and Transport Properties of InAs/A1Sb Superlattices," *Journal of Crystal Growth*, vol. 150, pp. 879–882 (1995).

Patent Abstract of Japan, Publication No. 02232931, Publication Date Sep. 14, 1990, 1 page.

Pekarik, John J., et al., "An AlSb–InAs–AlSb Double–Heterojunction P–n–P Bipolar Transistor," *J. Vac. Sci. Technol. B*, vol. 10, No. 2, pp. 1032–1034 (1992).

* cited by examiner

*Primary Examiner*—Steven Loke
*Assistant Examiner*—Donghee Kang
(74) *Attorney, Agent, or Firm*—Ladas & Parry

(57) ABSTRACT

A semiconductor structure and a method of forming same is disclosed. The method includes forming, on a substrate, an n-doped collector structure of InAs/AlSb materials; forming a base structure on said collector structure which base structure comprises p-doped GaSb; and forming, on said base structure, an n-doped emitter structure of InAs/AlSb materials. The collector and emitter structure are preferably superlattices each comprising a plurality of periods of InAs and AlSb sublayers. A heterojunction bipolar transistor manufactured using the method is disclosed.

18 Claims, 8 Drawing Sheets

SUPERLATTICE FABRICATION FOR INAS/GASB/ALSB SEMICONDUCTOR STRUCTURES

This is a divisional of U.S. Ser. No. 09/389,759 filed on Sep. 2, 1999 now U.S. Pat. No. 6,320,212.

FIELD OF THE INVENTION

The present invention pertains to an InAs/GaSb/AlSb semiconductor structure useful in making bipolar junction transistors (BJTs), and more particularly useful in making heterojunction bipolar transistors (HBTs) and still more particularly useful for making npn HBTs having small (submicron) feature sizes. The present invention also pertains to a method of making same.

BACKGROUND

HBT integrated circuits have found wide acceptance in industry for use in applications as diverse as satellite communication systems, radar systems, cable television systems, optical receivers, etc. Prior art HBTs tend to be Gallium Arsenide (GaAs) devices. With the industrial acceptance of HBTs has come the need for HBT devices which can be made smaller but without sacrificing the gain of the device and for HBT devices which can operate at even higher frequencies than prior art GaAs devices.

HBTs manufactured from an Indium Arsenide/Aluminum Antimonide/Gallium Antimonide (InAs/AlSb/GaSb) system possess a number of advantages over prior art GaAs HBTs. For example, GaSb is an excellent high-frequency p-type base material, having higher hole mobility than presently used base materials, such as GaAs and $In_{0.53}Ga_{0.47}As$. It can be p-doped with Si to densities approaching $10^{20}/cm^3$, which are equal to the highest densities achievable with GaAs and InGaAs (using C as a dopant). Since base resistance is inverse to the product of hole mobility and doping level, the higher mobility translates to lower resistance for p-doped GaSb bases, which will increase the operating frequency limit of a device.

An InAs/AlSb/GaSb material system is also preferable for HBTs being fabricated with submicron feature sizes. Prior art HBTs have relatively low surface Fermi level pinning energy, and as a consequence suffer from recombination of carriers at mesa sidewalls resulting in substantial surface depletion effects. As feature dimensions shrink, these surface effects become proportionally more significant, limiting the size reduction which can be achieved without excessive loss of device performance in terms of the gain of the device. By contrast, the surface pinned energy for GaSb is near the valence band maximum. Accordingly, a p-type GaSb base layer would not have significant surface depletion effects at mesa sidewalls, and could thus be scaled down with less loss of gain due to such surface effects.

In addition to the above advantages, the InAs/AlSb/GaSb material system allows very flexible bandgap engineering. InAs, AlSb, and GaSb have nearly equal lattice constants, such that varying combinations of the materials may be fabricated, in reasonable thicknesses, without suffering serious crystalline defects. Consequently, flexible engineering is possible which will permit implementation of advanced features, such as drift fields in the base material to sweep minority carriers across the base to the collector.

A pnp InAs/AlSb/GaSb structure has been tested, as reported by Pekarik et al., "An AlSb-InAs-AlSb double-heterojunction P-n-P bipolar transistor," J. Vac. Sci. Technol. B, volume 10 no. 2, March/April 1992, pps. 1032–1034. This device does not employ either a GaSb base nor a superlattice in the emitter or collector, and is not of the preferred npn structure. Npn HBT devices are generally preferred by those skilled in the art for high performance applications.

Although desirable, InAs/AlSb/GaSb heterostructure systems have been difficult to fabricate. First, the available emitter materials, AlGaSb or AlSb, require Tellurium (Te) for n-type doping. Tellurium is inconvenient for use in Molecular Beam Epitaxy (MBE) systems, because its memory effects make it difficult to avoid unwanted Te in subsequent layers, and because the Te ties up an available port. Second, AlGaSb and AlSb have a conduction band mismatch with the preferred GaSb base materials. If they are to be used as emitter materials, they need sophisticated grading to deal satisfactorily with the conduction band offset. They are even less desirable as collector materials, because the noted conduction band offset can cause a trapping of carriers.

Accordingly, there is a need for an InAs/AlSb/GaSb HBT structure having a GaSb base, and having improved conduction band alignment across the base-emitter and base-collector junctions. Ideally, such an HBT would be easy to dope. The present invention addresses these needs by employing an InAs/AlSb superlattice which can be constructed to achieve nearly perfect conduction band alignment with GaSb. The entire HBT structure can be doped using only Si for both n-doping of the emitter and collector and for p-doping of the GaSb base. Moreover, the InAs/AlSb superlattice has a valence band offset to GaSb of approximately 0.475 V, enhancing the gain characteristics of devices fabricated according to the present invention.

Si-doped InAs/AlSb superlattices have been used as n-type cladding layers for infrared lasers, as described in U.S. Pat. No. 5,594,750 to Hasenberg and Chow. They have also been used as Schottky barrier layers [Chow, Dunlap, et al., IEEE ElectronDevice Letters, Vol. 17, p. 69 (1996)].

SUMMARY OF THE INVENTION

It is an object of the present invention to provide a method of forming an InAs/GaSb/AlSb structure which can be used in the manufacture of HBTs which permits conduction-band alignment of the junctions.

Preferably, the layers of the structure can be easily doped to desired densities and therefore the use of Te as a dopant can be avoided.

Briefly, and in general terms, the present invention provides a method of forming a semiconductor structure comprising the steps of: (i) forming, on a substrate, an n-doped collector structure of InAs/AlSb materials; forming a base structure on said collector structure which base structure comprises p-doped GaSb; and forming, on said base structure, an n-doped emitter structure of InAs/AlSb materials.

Preferably the collector and/or emitter structures are provided by superlattice structures having sublayers of InAs and AlSb with thicknesses selected to yield a conduction band edge for the superlattice structures approximately equal to the conduction band edge of GaSb.

DESCRIPTION OF THE PREFERRED EMBODIMENT

Figure 1:
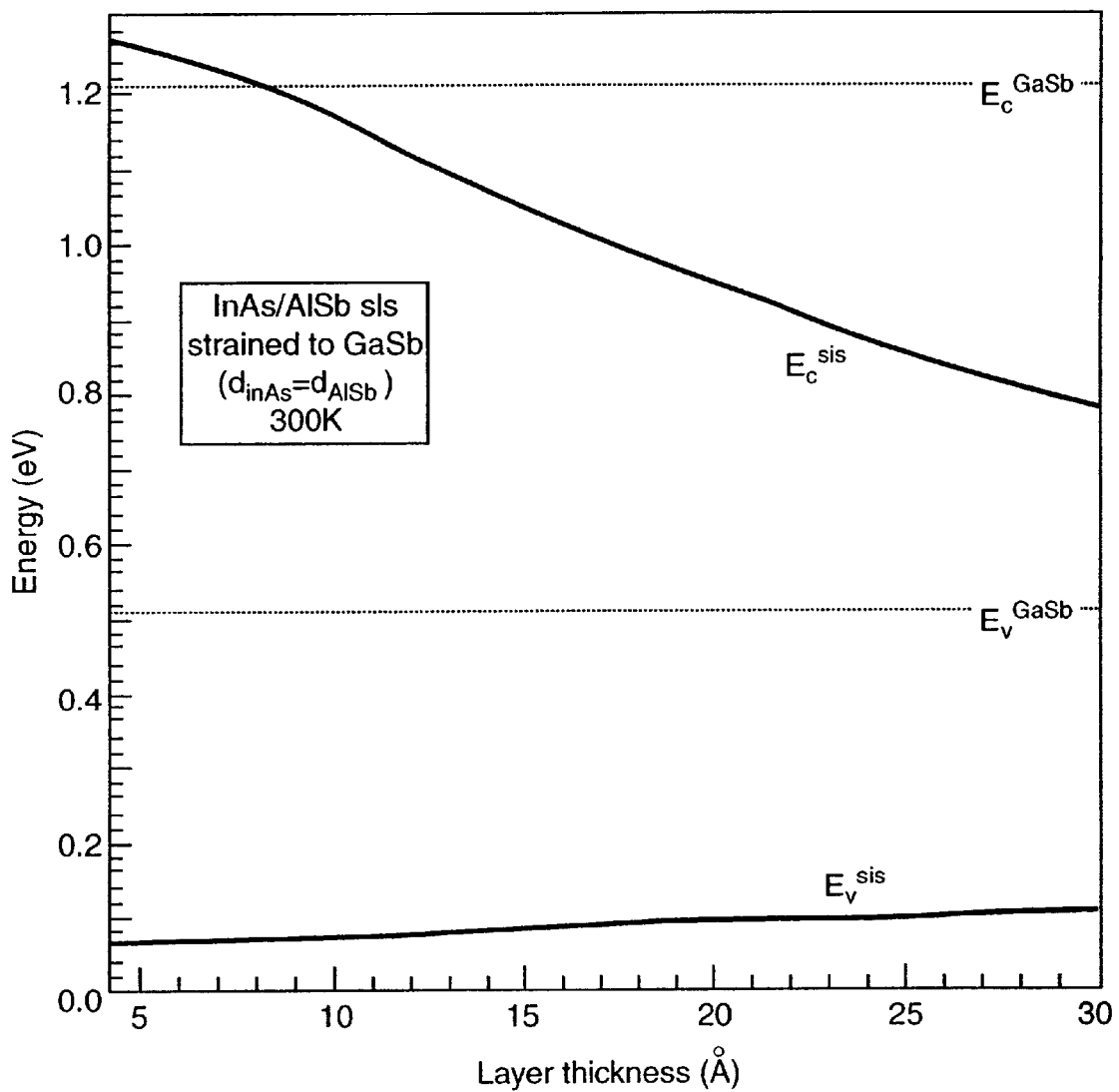
FIG. 1 depicts the conduction and valence band edges of an InAs/AlSb superlattice as a function of constituent layer thickness;.

FIG. 1 is a graph of the conduction and valence band edges of an InAs/AlSb superlattice as a function of constituent layer thicknesses. In this case the InAs sublayer thickness is equal to the AlSb sublayer thickness in each constituent layer (or period) of the superlattice. The conduction band edge of the superlattice can be varied over a wide range, including values above and below the GaSb conduction band ($E_c^{GaSb}$) at about 1.2 eV above the valence band maximum of InAs. As can be seen, the conduction band of the superlattice ($E_c^{sls}$) will equal the GaSb conduction band when the thickness of the constituent InAs and AlSb sublayers equal about 7.5 Å. This fact will prove useful when selecting the thicknesses of certain InAs and AlSb layers in superlattice structures used in the preferred embodiment of the present invention to be discussed with reference to FIG. 3. In contrast to the conduction band energy, the valence band energy of the superlattice ($E_v^{sls}$) does not change significantly with layer thickness and is located 400 meV below the valence band maximum of GaSb ($E_v^{GaSb}$).

Figure 2:
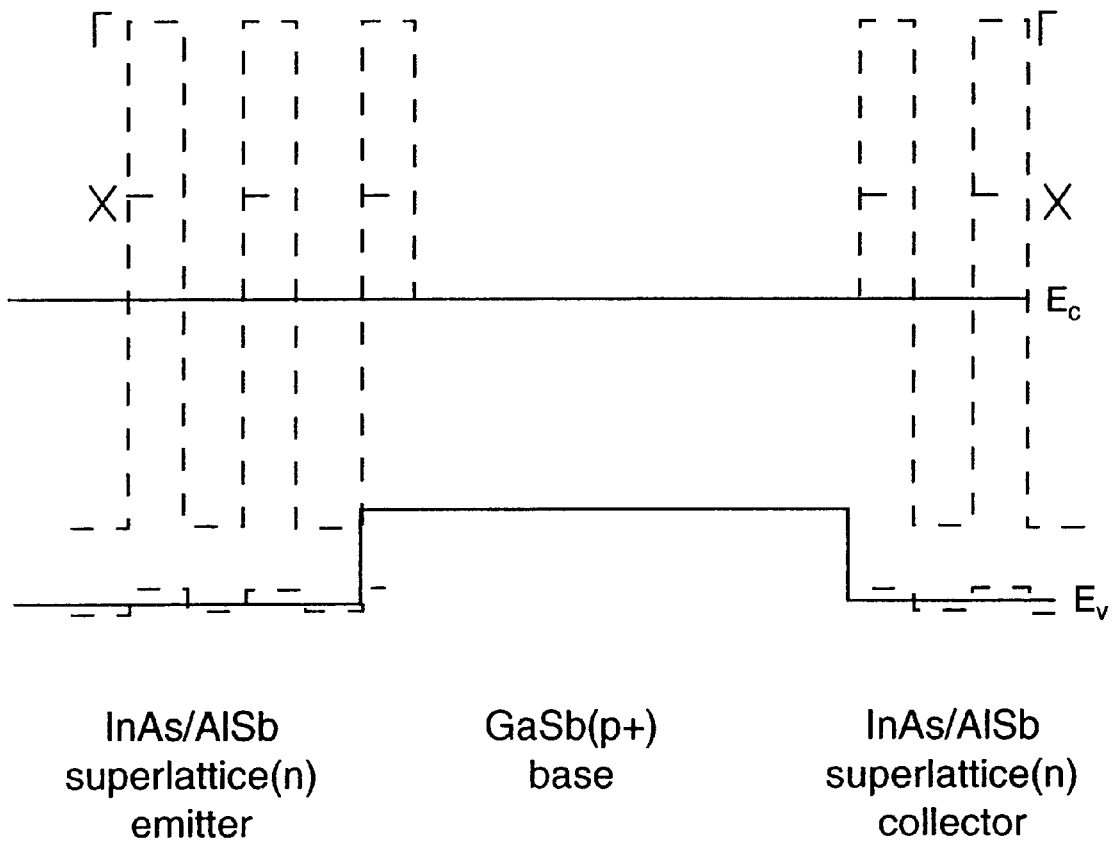
FIG. 2 is a diagram of the band energies for the preferred emitter, base and collector.

FIG. 2 is a flat band diagram for a HBT structure with a n-type InAs/AlSb superlattice emitter, p-type GaSb base and an n-type InAs/AlSb superlattice collector. The diagram shows both the bulk InAs and AlSb band edges (in dashed lines) and the effective superlattice band edges in the emitter and collector layers of the HBT device in solid lines). Preferably, the constituent superlattice layer thicknesses are selected such that the conduction band edges in both the emitter and collector align with the conduction band edge in the GaSb base so that there is a zero conduction bank offset, while at the same time the valence band edges are appropriately misaligned by approximately 400 meV. How this can be accomplished will be described with reference to FIG. 3.

Superlattice structures are welt known in the art. For additional information the reader is directed to "Structural and transport properties of InAs/AlSb superlattices" by D. H. Chow et al. published in the Journal of Crystal Growth vol 150 (1995) at pages 879–882, the disclosure of which is hereby incorporated herein by this reference. The reader is also directed to "InAs/AlSb/GaSb Resonant Interband Tunneling Diodes and Au-on-InAs/AlSb-Superlattice Schottky Diodes for Logic Circuits" by D. H. Chow et al published in IEEE Electron Devices Letters, Vol 17, No. 2, February 1996, the disclosure of which is hereby incorporated hereby by this reference.

Figure 3:
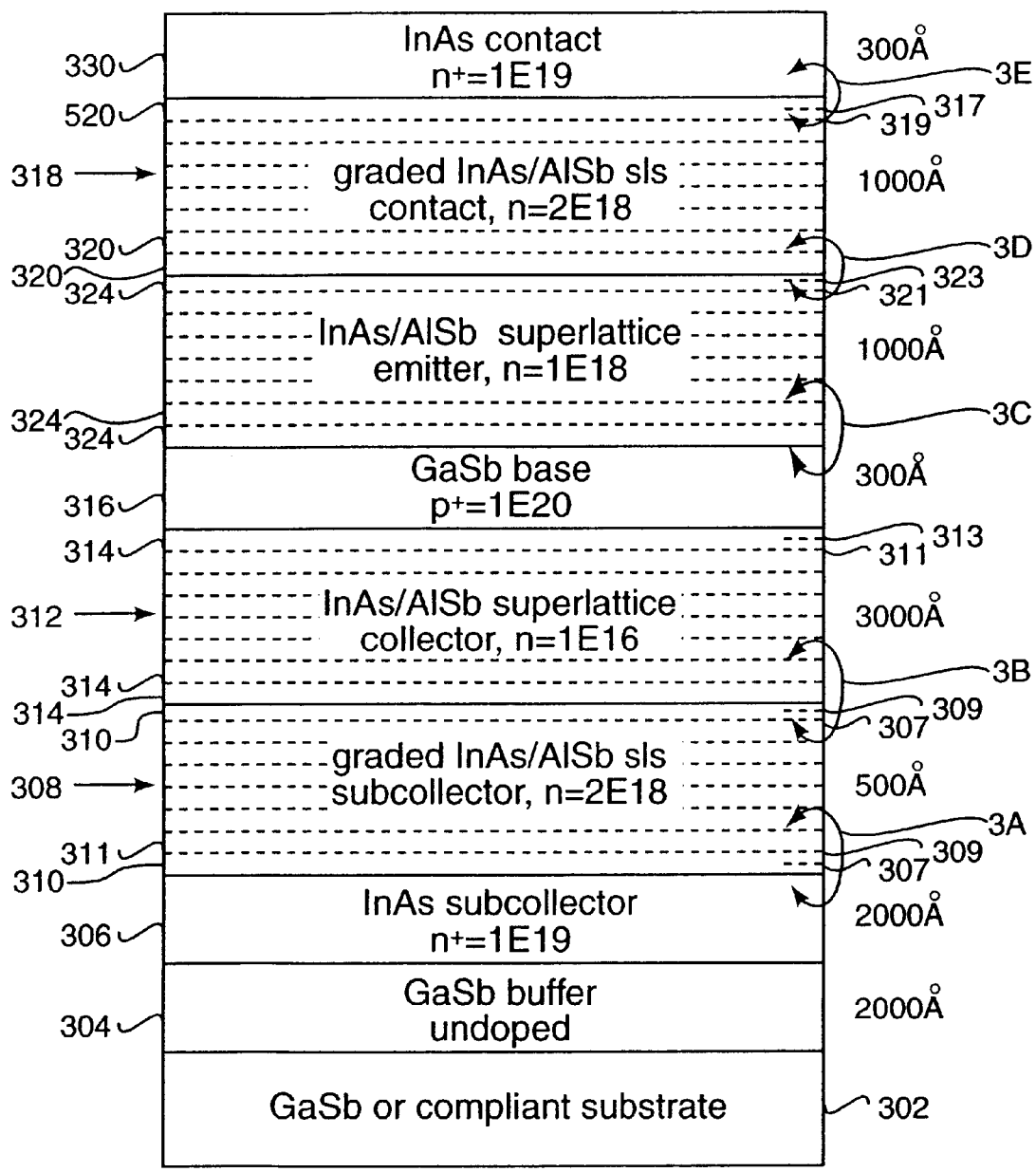
FIG. 3 depicts the structure of a semiconductor structure according to the present invention.

FIG. 3 shows an epitaxial structure for making a HBT in accordance with the present invention. Substrate 302 is preferably GaSb at the present time, although it is anticipated that continued improvements in compliant substrates may permit the use of other substrate materials, such as GaAs or InP. Subsequent layers are preferably grown by standard Molecular Beam Epitaxy (MBE) techniques, though any technique capable of providing the correct layer structure would be satisfactory. An undoped GaSb buffer layer 304 is grown on substrate 302 to a thickness of about 2000 Å. A subcollector 306, grown upon buffer layer 304, is preferably InAs, n-doped to a density of about $10^{19}/cm^3$ using Si, and is grown to a thickness of about 2000 Å. InAs provides nearly perfect ohmic contact to the non-alloyed metallization, not shown, which will be deposited on subcollector 306 to provide the collector connection. The preferred metallization is Gold Germanium (AuGe), although Au and Al (Aluminum) are also considered to be satisfactory metals for the contacts formed for the emitter, base and collector.

An optional subcollector grading layer 308 is preferably a chirped superlattice which shifts the effective collector composition gradually to lattice match the InAs preferred for subcollector 306, thereby reducing charge-impeding band discontinuities between collector 312 and subcollector 306. Subcollector grading layer 308 includes about ten grading periods 310, each period 310 having a sublayer 307 of AlSb and a sublayer 309 of InAs. Each period 310 may be conveniently of the same thickness, preferably about 50 Å, but the thicknesses of the periods 310 may range from about 2 to 100 Å and the periods 310 need not necessarily all be of the same thickness. Preferably, n-doping of subcollector grading layer 308 is effected to a desired doping level of about $1*10^{19}/cm^3$ by doping only InAs-containing sublayers 309 with Si, to a density equal to the desired doping level divided by the proportion of the InAs-containing sublayer 309 within the particular period 310. Preferably, the thicknesses of the AlSb sublayers 307 increase with the thicknesses of the associated InAs sublayers 309 decreasing as the periods 310 progress from the period immediately adjacent subcollector 306 towards collector 312.

Figure 3A:
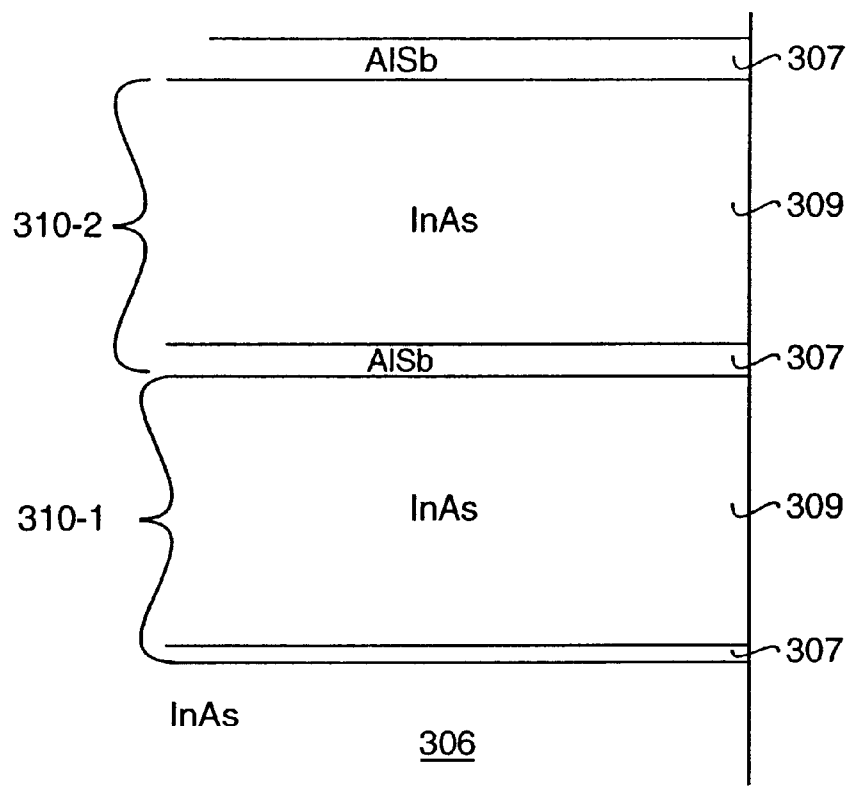
FIGS. 3A–3E depict details of the structure shown by FIG. 3.

For an example, consider the layer structure of grading layer 308 in the preferred embodiment, as shown in FIG. 3 and as shown in even greater detail by FIG. 3A. FIG. 3A shows a small portion of layer 306 and the first two periods immediately adjacent layer 306, namely the immediately adjacent period 301-1 and the next following period 310-2, as well as sublayer 307 of the third period. In the first period 310-1 of subcollector grading layer 308, sublayer 307 comprises a layer of AlSb with a thickness of preferably ½₂ of the period 310 thickness (which is preferably 50 Å) so the thickness of sublayer 307 in the first period 310-1 is preferably about 2.273 Å thick, while sublayer 309 comprises a layer of InAs having a thickness of ²¹⁄₂₂ of the period 310 thickness, so the thickness of sublayer 308 in the first period 310-1 is preferably about 47.727 Å. The thickness of the first period 310-1 is 50 Å, since, as indicated above, 50 Å is the preferred thickness for each period 310. In each subsequent period 310, sublayer 307 increases in thickness by about ½₂ of the period thickness (or about 2.273 Å) while sublayer 309 decreases in thickness by about the same amount. Thus, the thickness of AlSb sublayer 307 of the tenth period 310-10 is preferably ¹⁰⁄₂₂ of the period 310 thickness (or about 22.73 Å), while the thickness of the InAs sublayer 309 of the tenth period 310-10 is preferably ¹²⁄₂₂ of the period 310 thickness (or about 27.27 Å). Since the desired average doping density is preferably $2*10^{18}/cm^3$, the InAs sublayer 309 in the first period 310-1 preferably is doped to $(50/47.727) \times 2*10^{18}/cm^3$, or about $2.1*10^{18}/cm^3$, while the InAs sublayer 309 in the tenth period preferably is doped to $(50/27.27) \times 2*10^{18}/cm^3$, or about $3.67*10^{18}/cm^3$.

This technique results in a constant average doping density through the optional grading layer 308. However, since the grading layer 308 is itself optional, the grading layer 308, if used, may be of a more simple construction. For example, the preferred average doping density of $2*10^{18}/cm^3$ for the grading layer 308 could be maintained by keeping the dopant concentration in each InAs sublayer 309 constant as opposed to adjusting the doping depending on the thickness of each sublayer 309 of InAs.

Figure 3B:
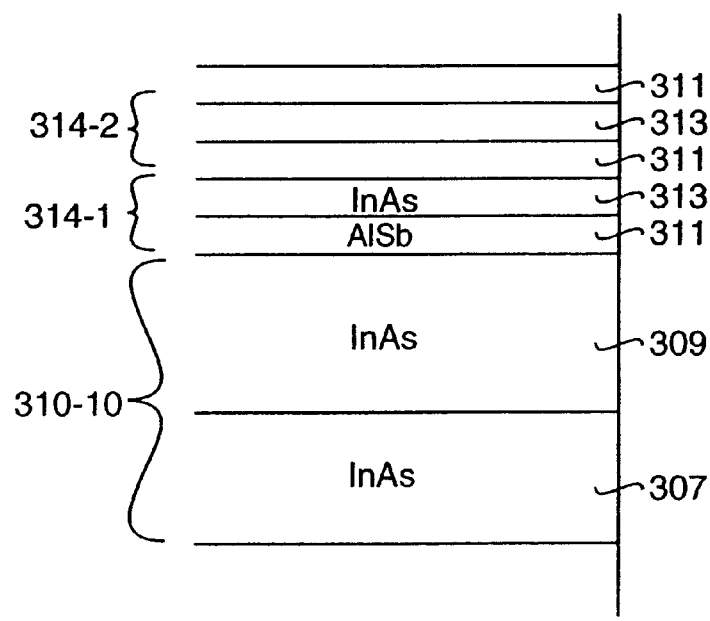

Collector 312 is preferably provided by a superlattice of InAs and AlSb, grown to a thickness of preferably 3000 Å. Turning also to FIG. 3B, a small portion (two periods 314-1 and 314-2 are identified) of the superlattice collector 312 immediately adjacent the tenth period 301-10 of the grading layer 308 is depicted. Superlattice periods 314 each have a sublayer 311 of AlSb and a sublayer 313 of InAs. If, within each period 314, the thickness of the AlSb sublayer 311 is equal to the thickness of its adjacent InAs sublayer 313, the resultant superlattice collector 12 is very nearly lattice-matched to GaSb, having a mismatch ($\Delta a/a$) of only $5\times 10^{-4}$. As has been explained with reference to FIG. 1, the conduction band energy of the superlattice collector 312 is a function of the thicknesses of sublayers 311 and 313. Sublayer thicknesses of about 7.5 Å for the sublayers 311 and 313 in the periods 314 of the superlattice are preferred (particularly near the base 316) in order for the conduction band energy at the edge of the collector superlattice 312 to align with the conduction band of the base 316 of the HBT, which base 316, as will be seen, is preferably formed of doped GaSb. In order to achieve an effective average doping density of about $10^{16}/cm^3$, the AlSb sublayers 311 are preferably undoped while the InAs sublayers 313 are preferably doped to about $2*10^{16}/cm^3$. The overall thickness of the collector 312 is preferably 3000 Å. The thickness of each period 314 is preferably 15 Å, at least adjacent the base 316. If the 15 Å period 314 thickness were maintained throughout the entire preferred 3000 Å thickness of the collector 312, then the collector 312 would comprise approximately 200 periods 314. Preferably, however, the periods 314 increase slightly in thickness as the periods are more and more remote from the base, so that the period 314 thickness preferably increases to about 20 Å in the center of the base 316.

In the embodiment of FIG. 3, base 316 is preferably bulk GaSb grown to a thickness of preferably 300 Å. The GaSb base is p-doped preferably with Si to a density of about $10^{20}/cm^3$.

Figure 3C:
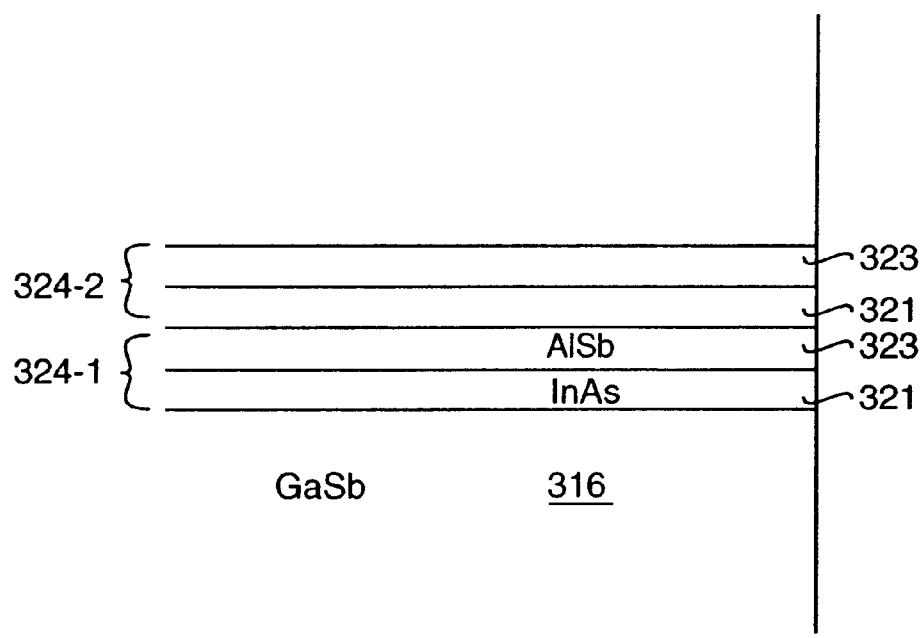

Emitter 322, grown upon base 316, is preferably a superlattice having repeating periods 324, each period 324 including a sublayer 323 of AlSb and a sublayer 321 of InAs. FIG. 3C shows two periods 324-1 and 324-2, period 324-1 being the period 324 immediately adjacent base 316. It is generally preferred to align the conduction band energies of both the base-emitter and base-collector junctions. In this preferred embodiment, since base 316 is bulk GaSb, emitter 322 is preferably grown in a structure similar to that of collector 312 in order to attain the same conduction band energy of about 1.2 eV above the valence band maximum of InAs. Accordingly, sublayers 323 and 321 are each preferably 7.5 Å thick. Emitter 322 differs from collector 312 in that it is preferably grown to a lesser thickness (of about 1000 Å) and is doped more heavily than the collector 312. Emitter 312 is preferably n-doped, using Si, to a density of about $10^{18}/cm^3$, by doping the InAs sublayers 321 to a density of $2*10^{18}/cm^3$. In that way the AlSb sublayers 323 may be left undoped.

Figure 3D:
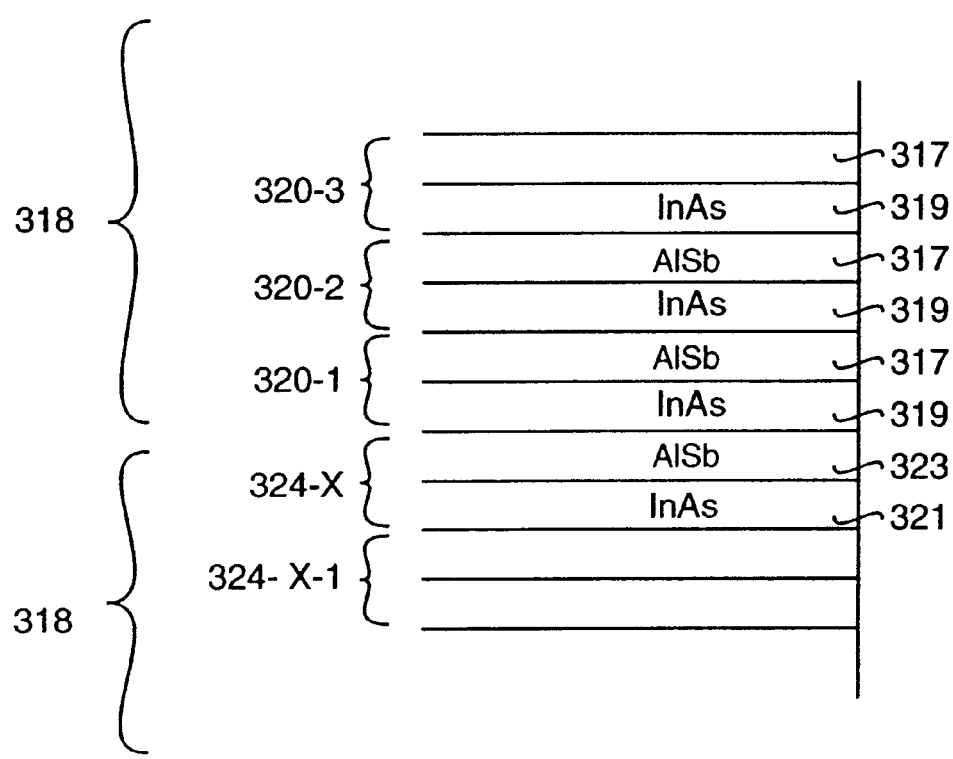
Figure 3E:
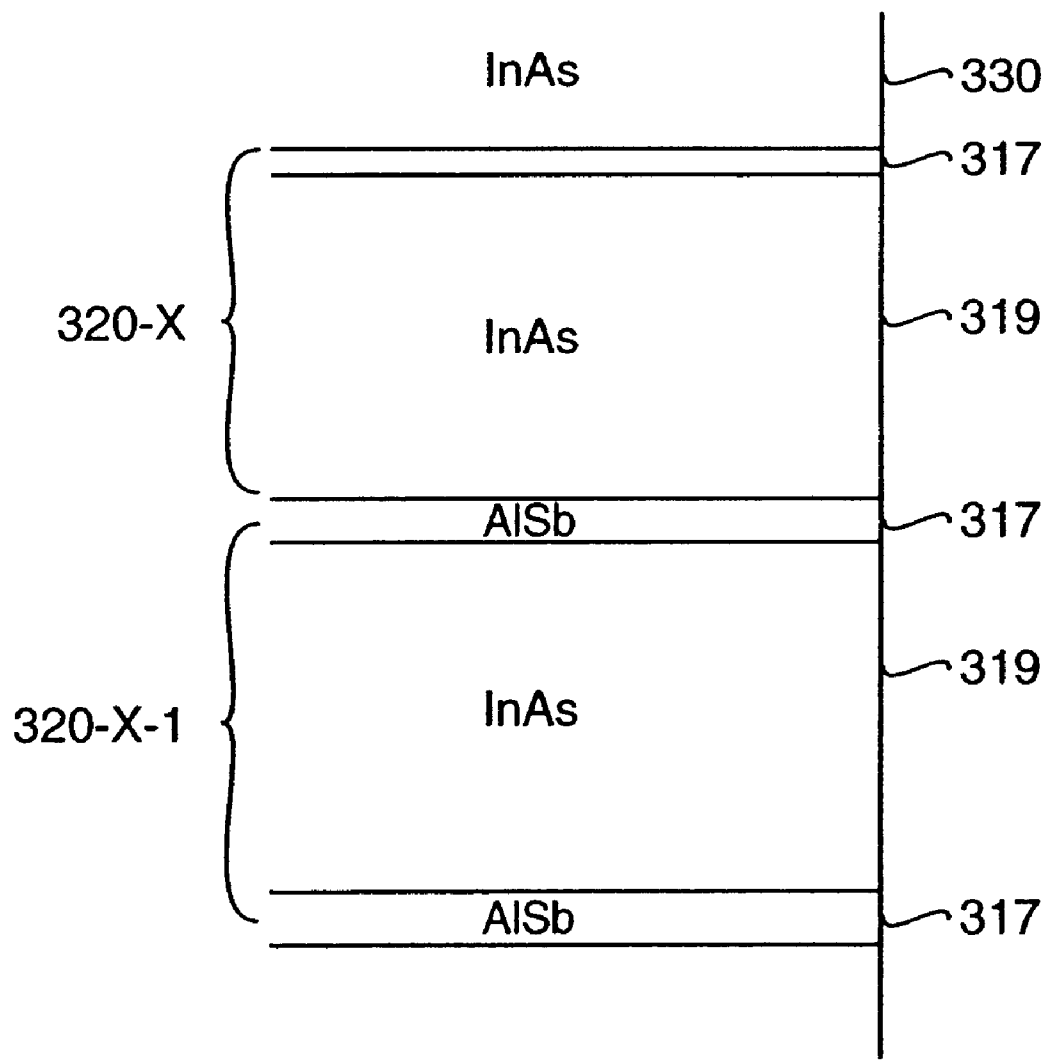

Emitter contact grading layer 318 is somewhat similar to the subcollector grading layer 308 in this embodiment, the emitter contact grading layer 318 including preferably a number of periods 320, starting with a period thickness of about 15 Å at the juncture with the emitter layer 322 and increasing to a period thickness of about 50 Å thick adjacent the InAs contact layer 330. Each period 320 comprises an InAs sublayer 319 and a AlSb sublayer 317. FIG. 3D is a detailed view of a first few periods 320-1 through 320-3 of the emitter contact grading layer 318 immediately adjacent the last two periods 324-X and 324-X-1 of the emitter 322. If the total thickness of the emitter is indeed about 1000 Å, then X (the number of periods 324 in the superlattice emitter 322) will fall in the range of about 65 to 70. The proportional thickness of each InAs sublayer 319 within its period 320 conveniently increases each period from about $11/22$ in the first period 320-1 nearest emitter 322 to about $21/22$ in the last period 320-X immediately adjacent emitter contact 330. FIG. 3E is a detailed view of the last two periods 310-X-1 and 310-X next to the emitter contact 330. The thickness of each of the periods 320 is conveniently increased to about 50 Å while decreasing the proportional thickness of each AlSb sublayer 317 from about $11/22$ of the first period 320-1 to about $1/22$ of the last period 320-X. Emitter contact grading layer 318 has an overall preferred thickness of about 1000 Å. Doping is accomplished as in subcollector grading layer 308, by using Si n-type doping of the InAs sublayers 319 to achieve an average doping density of preferably $2*10^{18}/cm^3$ in emitter contact grading layer 318.

In the preferred embodiment of FIG. 3, emitter contact layer 330 is preferably bulk InAs grown to a thickness of preferably 300 Å. The InAs emitter contact 330 is n-doped preferably with Si to a density of about $10^{19}/cm^3$.

In the embodiment of FIG. 3, the base layer is described as being provided by bulk GaSb grown using known epitaxial techniques, such as MBE. However, instead of using a bulk material for the base, if a graded AlGa Sb alloy is provided instead, then a drift field for electrons crossing the base layer 316 can be provided and the emitter superlattice energy gap can be widened slightly to provide conduction band edge alignment at both the emitter-base and collector-base junctions. For example, $Al_{0.2}Ga_{0.8}$ Sb has a higher conduction band maximum than does GASb by about 100 meV. As such the InAs/AlSb superlattice emitter period 324 would have a smaller thickness in order to provide the appropriate alignment with the $E_C$ for $Al_{0.2}Ga_{0.8}$ Sb.

Figure 4:
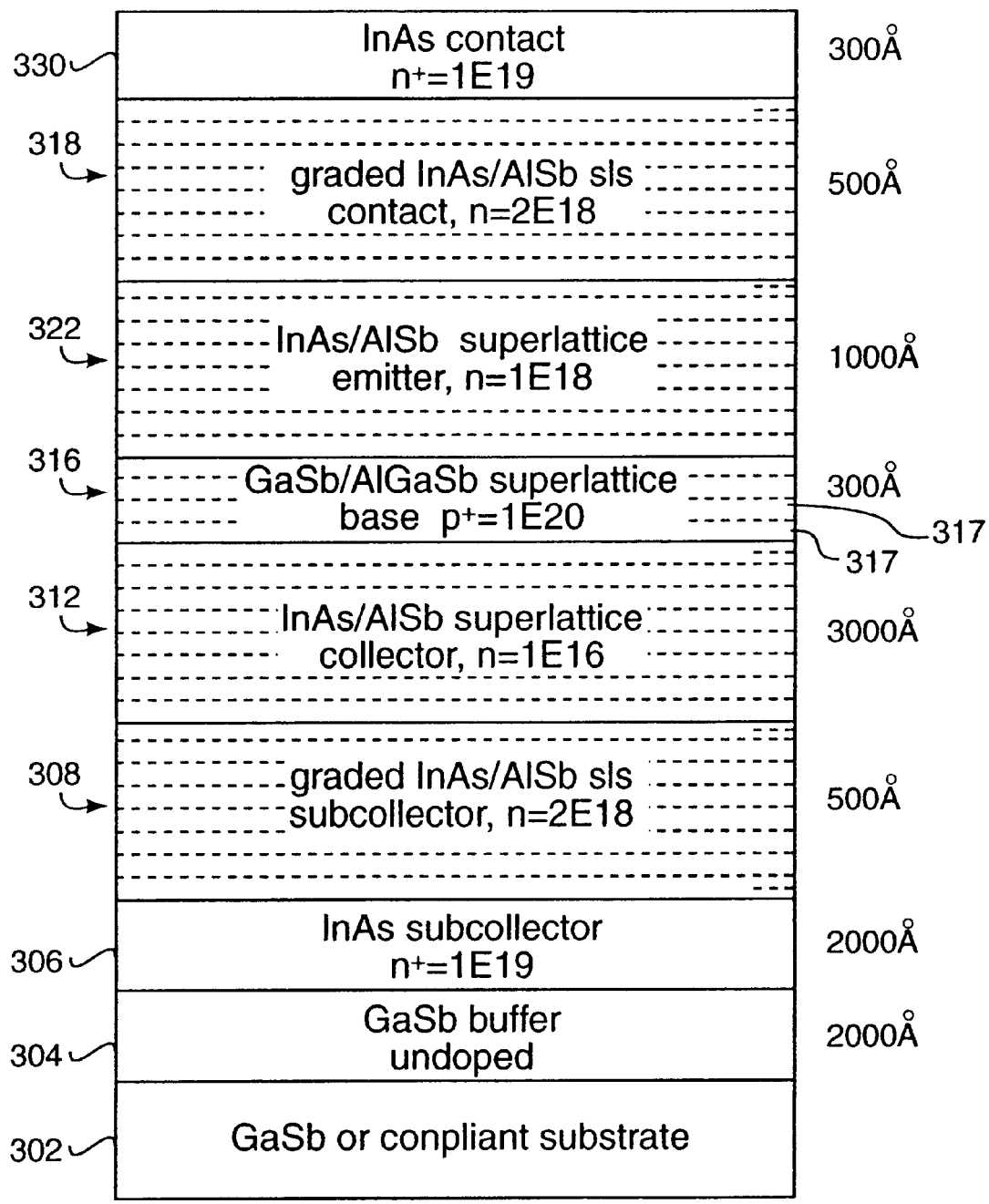
FIG. 4 depicts the structure of an alternative embodiment of the semiconductor structure of FIG. 3 with a superlattice base.

FIG. 4 shows another alternative embodiment of the base 316. Here the base 316 is a chirped superlattice, graded in ten periods 317 from GaSb at the collector junction to $Al_xGa_{1-x}Sb$ at the emitter junction. The $Al_xGa_{1-x}Sb$ composition may have x at the emitter end of from 0 to about 0.2. However, x is preferably equal to 0.1 and thus the base material 317 adjacent the emitter is preferably formed by $Al_{0.1}Ga_{0.9}Sb$.

Figure 5:
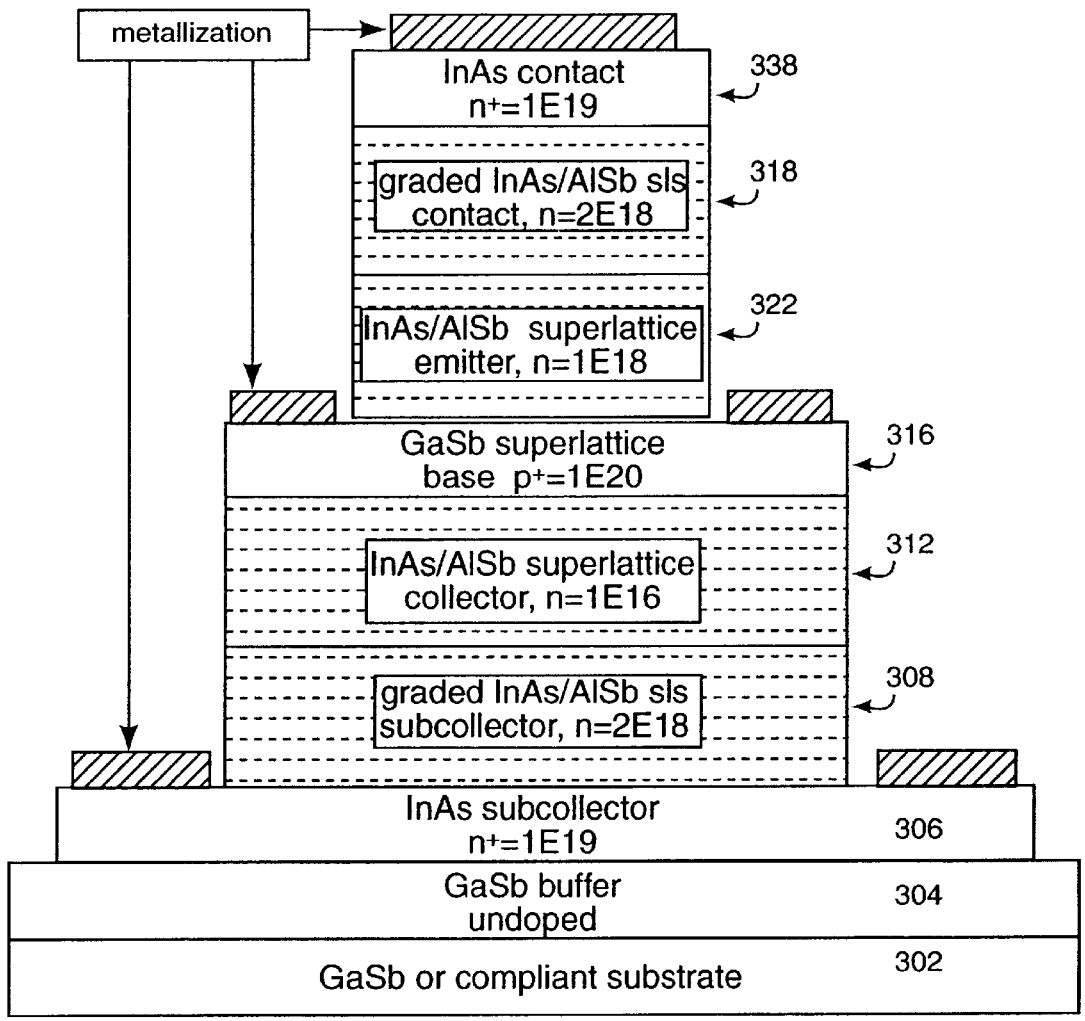
FIG. 5 depicts how the structures of FIGS. 3 and/or 4 may be etched and metallized in order to provide an HBT device.

The epitaxially grown structures shown in FIG. 3 or 4, after suitable masking and etching using well known techniques, can be etched to obtain the shape of the structure shown in FIG. 5. With the application of suitable metalization, the HBT structure shown in FIG. 5 is obtained. The metalization includes forming collector contacts 340, base contacts 345 and emitter contacts 350. Since masking and etching using the structures shown in FIG. 3 or 4 to attain the structure shown in FIG. 5 is rather straightforward for those skilled in the art, the details for how the masking and etching is carried out is a matter of design choice.

Having described the invention in connection with its preferred embodiments, modification will now suggest itself to those skilled in the art. As such the invention is not to be limited to the disclosed embodiments, expect as required by the appended claims.

What is claimed is:

1. A method of forming a semiconductor structure comprising the steps of:
   forming, on a substrate, an n-doped collector structure of a superlattice of InAs/AlSb materials;
   forming a base structure on said collector structure which base structure comprises p-doped GaSb; and
   forming, on said base structure, an n-doped emitter structure of a superlattice of InAs/AlSb materials.

2. The method of forming a semiconductor structure according to claim 1 wherein said emitter structure includes an emitter superlattice having sublayers containing InAs and sublayers containing AlSb.

3. The method of forming a semiconductor structure according to claim 2 wherein the step of forming said emitter structure further includes forming an emitter contact layer of InAs.

4. The method of forming a semiconductor structure according to claim 3 wherein the step of forming said emitter superlattice further includes forming a chirped superlattice layer between the emitter superlattice and the emitter contact layer, the chirped superlattice at least partially grading a transition between the emiiter superlattice having sublayers containing InAs and sublayers containing AlSb and said emitter contact layer of InAs.

5. The method of forming a semiconductor structure of claim 4 wherein the step of forming the chirped superlattice includes controlling the thicknesses of the sublayers containing InAs and AlSb to shift an effective composition of the emitter superlattice gradually to match InAs of the emitter contact layer.

6. The method of forming a semiconductor structure according to claim 2 wherein the emitter superlattice comprises a number of periods of sublayers containing InAs and sublayers containing AlSb.

7. The method of forming a semiconductor structure according to claim 6, wherein each sublayer of at least one period has a thickness of approximately 7.5 Å.

8. The method of forming a semiconductor structure according to claim 6 wherein the periods of the emitter superlattice are thicker in the center of the emitter superlattice than they are adjacent the base structure.

9. The method of forming a semiconductor structure according to claim 2 wherein the wherein each sublayer has a thickness selected to yield a conduction band edge approximately equal to a conduction band edge of GaSb.

10. The method of forming a semiconductor structure according to claim 1 wherein said collector structure includes a collector superlattice having sublayers containing InAs and sublayers containing AlSb.

11. The method of forming a semiconductor structure according to claim 10 wherein the step of forming said collector structure further includes forming a subcollector layer of InAs.

12. The method of forming a semiconductor structure according to claim 11 wherein the step of forming said collector structure further includes forming a chirped superlattice layer between the collector superlattice and the subcollector layer, the chirped superlattice at least partially grading a transition between the collector superlattice having sublayers containing InAs and sublayers containing AlSb and said subcollector layer.

13. The method of forming a semiconductor structure of claim 12 wherein the step of forming the chirped superlattice includes controlling the thicknesses of the sublayers containing InAs and AlSb to shift the effective collector composition gradually to match the InAs of the subcollector layer.

14. The method of forming a semiconductor structure according to claim 10 wherein the emitter superlattice comprises a number of periods of sublayers containing InAs and sublayers containing AlSb.

15. The method of forming a semiconductor structure according to claim 14, wherein each sublayer of at least one period has a thickness of approximately 7.5 Å.

16. The method of forming a semiconductor structure according to claim 14 wherein the periods of the emitter superlattice are thicker in the center of the emitter superlattice than they are adjacent the base structure.

17. The method of forming a semiconductor structure according to claim 10 wherein each sublayer has a thickness selected to yield a conduction band edge approximately equal to the conduction band edge of GaSb.

18. The method of forming a semiconductor structure according to claim 1 wherein the emitter structure is more heavily doped than is the collector structure.

* * * * *